(12) United States Patent
Mason et al.

(10) Patent No.: US 9,088,083 B2
(45) Date of Patent: Jul. 21, 2015

(54) CONTACTS FOR USE WITH AN ELECTRONIC DEVICE

(75) Inventors: Jeffery W. Mason, North Attleboro, MA (US); Wayne Stewart Alden, III, Whitman, MA (US)

(73) Assignee: Tyco Electronics Corporation, Berwyn, PA (US)

( * ) Notice: Subject to any disclaimer, the term of this patent is extended or adjusted under 35 U.S.C. 154(b) by 342 days.

(21) Appl. No.: 13/414,216

(22) Filed: Mar. 7, 2012

(65) Prior Publication Data

US 2013/0237076 A1 Sep. 12, 2013

(51) Int. Cl.
*H01R 13/24* (2006.01)
*H05K 7/10* (2006.01)

(52) U.S. Cl.
CPC ........ *H01R 13/2421* (2013.01); *H01R 13/2435* (2013.01); *H05K 7/1069* (2013.01)

(58) Field of Classification Search
CPC ............. H01R 13/2421; H01R 12/714; H01R 2201/20; H01R 13/2428; H01R 13/187
USPC ............................................ 439/700, 824, 66
See application file for complete search history.

(56) References Cited

U.S. PATENT DOCUMENTS

| | | | |
|---|---|---|---|
| 4,904,213 A * | 2/1990 | Hock et al. | 439/824 |
| 5,410,260 A | 4/1995 | Kazama | |
| 5,727,954 A * | 3/1998 | Kato et al. | 439/66 |
| 6,254,438 B1 | 7/2001 | Gaunt | |
| 6,462,567 B1 | 10/2002 | Vinther et al. | |
| 6,506,082 B1 | 1/2003 | Meek et al. | |
| 6,663,439 B2 * | 12/2003 | Henry et al. | 439/700 |
| 6,769,919 B2 | 8/2004 | Kosmala | |
| 6,923,690 B1 * | 8/2005 | Wang | 439/824 |
| 7,025,602 B1 | 4/2006 | Hwang | |
| 7,077,709 B1 | 7/2006 | Shin-Ting | |
| 7,285,026 B1 * | 10/2007 | Ju | 439/700 |
| 7,841,866 B2 | 11/2010 | Hsu et al. | |
| 7,845,988 B2 | 12/2010 | Hsiao et al. | |
| 7,898,159 B2 * | 3/2011 | Heydt et al. | 310/317 |
| 8,251,755 B2 * | 8/2012 | Mulfinger et al. | 439/700 |
| 8,353,730 B1 * | 1/2013 | Wang et al. | 439/700 |
| 8,544,321 B2 * | 10/2013 | Jones, III | 73/248 |

FOREIGN PATENT DOCUMENTS

| | | |
|---|---|---|
| CN | 201594606(U) | 9/2010 |
| CN | 201601290(U) | 10/2010 |

OTHER PUBLICATIONS

First Office Action issued Dec. 1, 2014 for counterpart Chinese Application 201310070316.3 with English translation.

\* cited by examiner

*Primary Examiner* — Xuong Chung Trans

(57) ABSTRACT

A contact includes a contact body including a tip, a spring beam opposite the tip and a shoulder between the tip and the spring beam. A plunger is movable with respect to the contact body and has the plunger having a tip and a shoulder. A biasing member is contained by the shoulders. The biasing member imparts a biasing force on the shoulder of the plunger. The biasing member is compressed as the plunger moves relative to the contact body. The spring beam engages the plunger between the tip and the shoulder of the plunger and is spring biased against the plunger to electrically couple the contact body and the plunger. An electrical path is defined from the tip of the plunger to the spring beam and to the tip of the contact body. The electrical path is routed outside of the biasing member.

21 Claims, 4 Drawing Sheets

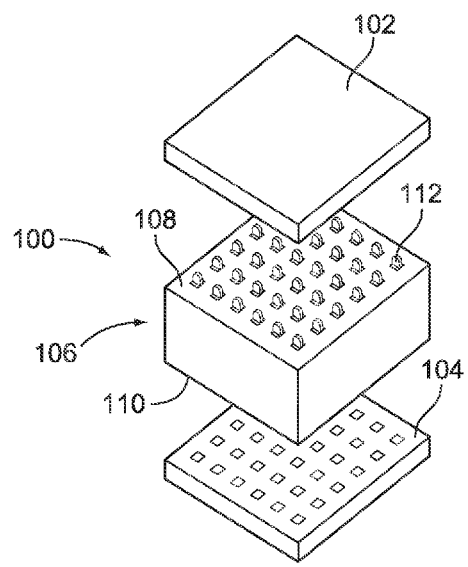
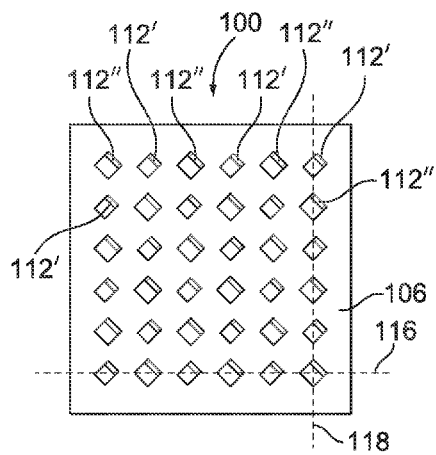
FIG. 1
FIG. 2
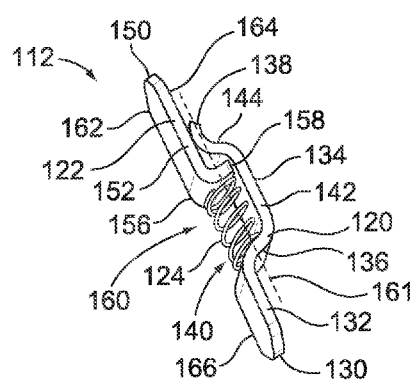
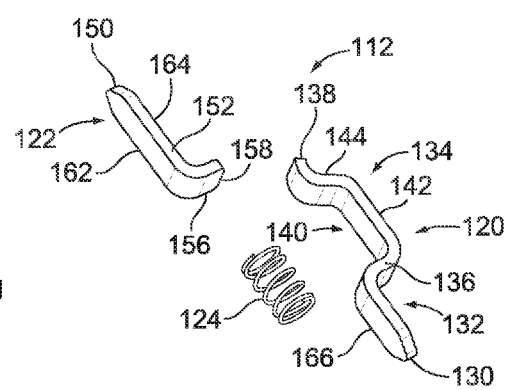
FIG. 3
FIG. 4

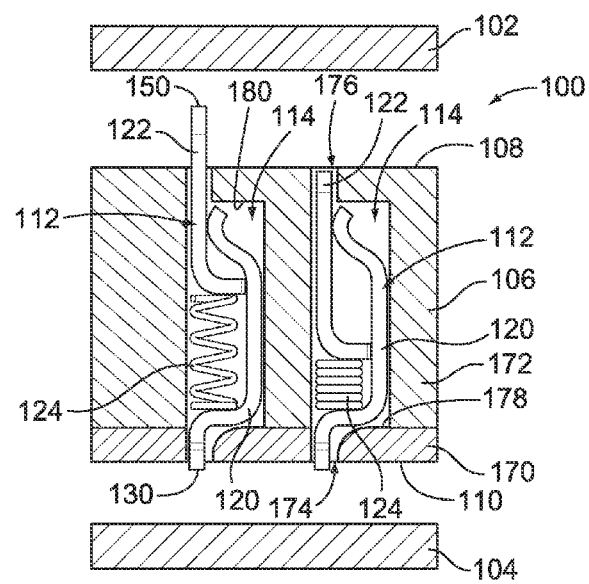
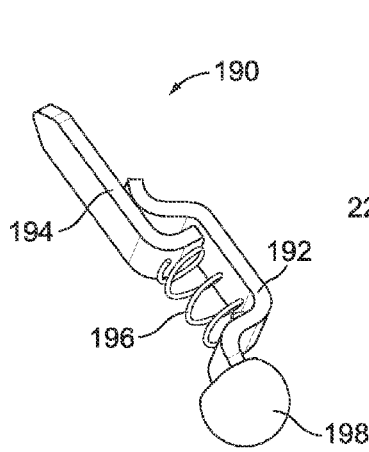
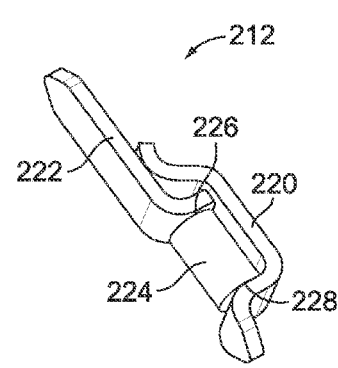
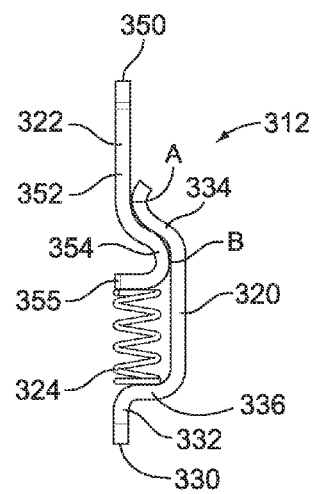

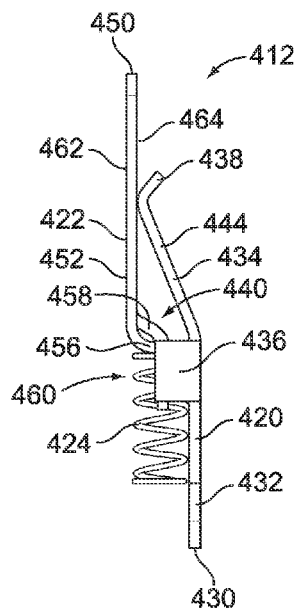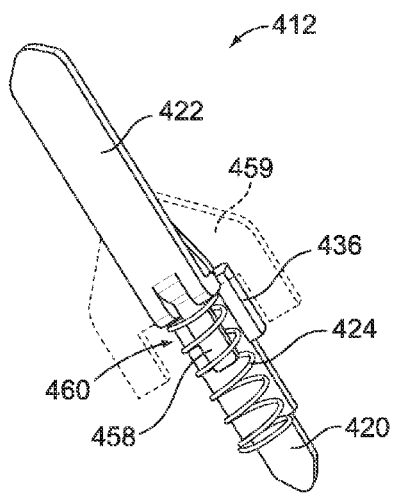
FIG. 9　　　　FIG. 10
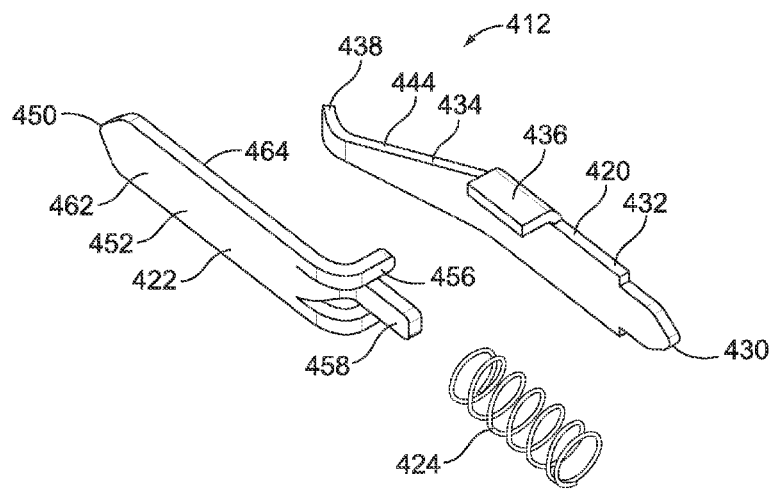
FIG. 11

CONTACTS FOR USE WITH AN ELECTRONIC DEVICE

BACKGROUND OF THE INVENTION

The subject matter herein relates generally to contacts for use in sockets for interconnecting two electronic components.

Sockets are used to interconnect two electronic components, such as an integrated circuit (IC) component and a printed circuit board (PCB). The sockets include an array of contacts held by an insulative socket body. Some known sockets have cantilever beam designs for the contacts. There is a desire to have the contacts on tighter pitches, which may cause a shortening in beam length. When the beam length is shortened, the amount of deflection is reduced and the beams are stiffer making mating with the electronic components more difficult and increasing the stress on the contacts. Increasing the density positions the contacts closer together, which makes the housing walls thinner. Additionally, the cantilever design tends to have some overlap of the contacts, which increases cross-talk and degrades the signal integrity.

Some known sockets are used for circuit testing of the electronic components. The contacts of such testing sockets are used for many cycles. The contacts of such testing sockets typically use spring probes that are spring loaded and separable. An example of such contact is known as a Pogo® pin having a cylinder containing two spring-loaded pins that interface with the two electronic components. The Pogo® pins are machined and expensive to manufacture. Other types of spring loaded contacts include two probes that are received in a coil spring. Such contacts require assembly time to load the ends of the probes into the spring, which is difficult and time consuming.

A need remains for a contact that is cost effective to manufacture and assemble in a socket. A need remains for a contact having high reliability.

BRIEF DESCRIPTION OF THE INVENTION

In one embodiment, a contact is provided including a contact body including a tip, a spring beam opposite the tip and a shoulder between the tip and the spring beam. A plunger is movable with respect to the contact body and has the plunger having a tip and a shoulder. A biasing member is contained by the shoulders of the contact body and the plunger. The biasing member imparts a biasing force on the shoulder of the plunger. The biasing member is compressed as the plunger moves relative to the contact body. The spring beam engages the plunger between the tip and the shoulder of the plunger and is spring biased against the plunger to electrically couple the contact body and the plunger. An electrical path is defined from the tip of the plunger to the spring beam and to the tip of the contact body. The electrical path is routed outside of the biasing member.

Optionally, the contact body and the plunger do not extend into the biasing member. The contact body may form a receiving space that receives the biasing member such that the contact body extends along an exterior of the biasing member. The receiving space may receive the biasing member and an inner end of the plunger opposite the tip of the plunger. The shoulder of the plunger may be provided at an inner end of the plunger opposite the tip of the plunger. The shoulders of the contact body and the plunger may be parallel to one another and spaced apart across a pocket. The biasing member may be received in the pocket. The shoulder of the contact body may be generally perpendicular to the shoulder of the plunger. The shoulder of the plunger may engage an end of the biasing member. The shoulder of the contact body may engage a side of the biasing member.

In another embodiment, a contact is provided having a plunger having a tip and a shoulder and a contact body including a tip, a spring beam opposite the tip and a shoulder between the tip and the spring beam. The spring beam engages the plunger between the tip and the shoulder of the plunger and is spring biased against the plunger to electrically couple the contact body and the plunger. A biasing member is contained by the shoulders of the contact body and the plunger. The biasing member is a polymer element having spring characteristics that imparts biasing forces on the shoulder of the plunger. The biasing member is compressed as the plunger moves relative to the contact body.

In a further embodiment, an electronic device is provided having a socket body having a first surface and a second surface and a plurality of contact chambers between the first and second surfaces. The electronic device has a plurality of contacts received in corresponding contact chambers. The contacts each include a plunger having a tip and a shoulder. The tip of the plunger extends beyond the first surface for mating with a first component and is retractable into the socket body. The contacts each include a contact body including a tip, a spring beam opposite the tip and a shoulder between the tip and the spring beam. The tip of the contact body extends beyond the second surface for mating with a second component and is retractable into the socket body. The spring beam engages the plunger between the tip and the shoulder of the plunger and is spring biased against the plunger to electrically couple the contact body and the plunger. A biasing member is contained by the shoulders of the contact body and the plunger. The biasing member imparts biasing forces on the shoulder of the plunger. The biasing member is compressed as the plunger moves relative to the contact body. An electrical path is defined from the tip of the plunger to the spring beam and to the tip of the contact body. The electrical path is routed outside of the biasing member.

BRIEF DESCRIPTION OF THE DRAWINGS

FIG. 1 illustrates an electronic device used to interconnect a first electronic component with a second electronic component.

FIG. 2 is a top view of the electronic device in accordance with an exemplary embodiment.

FIG. 3 is a side perspective view of an assembled contact for the electronic device.

FIG. 4 is an exploded, side perspective view of the contact.

FIG. 5 is a cross section view of a portion of the electronic device.

FIG. 6 is a side perspective view of a contact formed in accordance with an exemplary embodiment.

FIG. 7 illustrates a contact formed in accordance with an exemplary embodiment.

FIG. 8 is a side view of a contact formed in accordance with an exemplary embodiment.

FIG. 9 is a side perspective view of an assembled contact.

FIG. 10 is a perspective view of the contact shown in FIG. 9.

FIG. 11 is an exploded, side perspective view of the contact shown in FIG. 9.

DETAILED DESCRIPTION OF THE INVENTION

Figure 12:
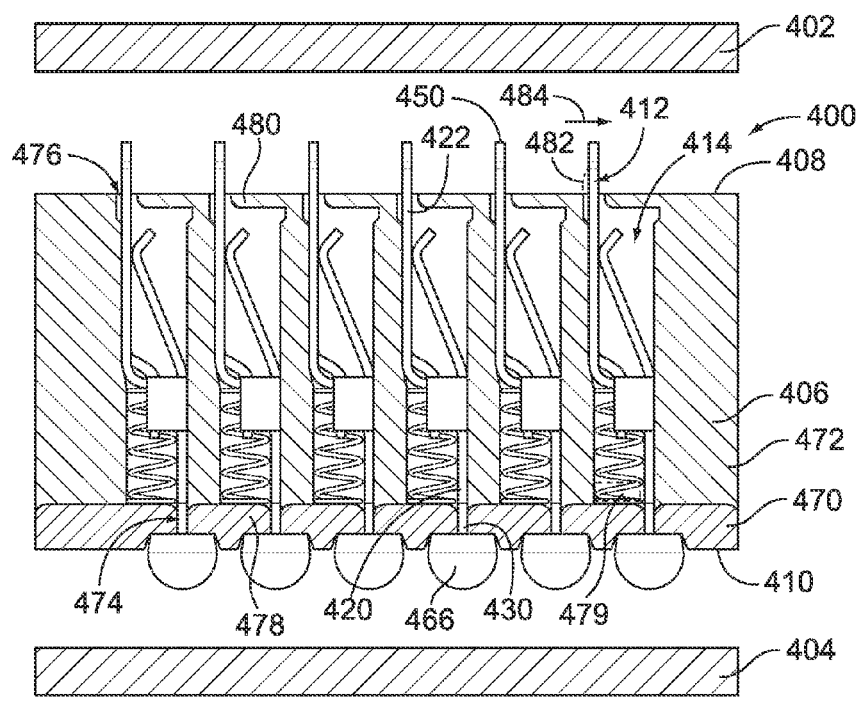
FIG. 12 is a cross section view of a portion of an electronic device formed in accordance with an exemplary embodiment.

FIG. 1 illustrates an electronic device 100 used to interconnect a first electronic component 102 with a second electronic component 104. In an exemplary embodiment, the electronic device 100 constitutes a socket, and may be referred to hereinafter as a socket 100. The electronic device 100 may be an interposer or interconnect that is positioned between the first and second electronic components 102, 104 to electrically connect circuits of such components.

In an exemplary embodiment, the electronic device 100 is mated to the first electronic component 102 at a separable mating interface. The electronic device 100 may be repeatedly mated and unmated with the first electronic component 102 or similar electronic components. In an exemplary embodiment, the electronic device 100 may define a test socket for testing an integrated circuit (IC) component or similar type of component. The IC components may be repeatedly tested and removed from the electronic device 100.

The electronic device 100 may be permanently or temporarily coupled to the second electronic component 104. For example, solder balls may be provided along the mating interface between the electronic device 100 and the second electronic component 104 to couple the electronic device 100 to the second electronic component 104. Alternatively, the electronic device 100 may be mated to the second electronic component 104 at a separable interface, such as by using spring loaded or spring biased contacts to make an electrical connection with the second electronic component 104.

The socket 100 includes a socket body 106 having a first surface 108 and a second surface 110. The socket body 106 holds a plurality of contacts 112 for interfacing with the first and second electronic components 102, 104. The contacts 112 may be held in contact chambers 114 (shown in FIG. 5) defined within the socket body 106. The socket 100 may hold any number of contacts 112. The pattern or arrangement of the contacts 112 may correspond with the corresponding contacts or pads on the first and second electronic components 102, 104 to ensure that the contacts 112 are mated to corresponding circuits of the first and second electronic components 102, 104.

In an exemplary embodiment, the contacts 112 are designed to have a tight pitch between adjacent contacts 112. The contacts 112 are designed to be deflectable at the first surface 108 and/or the second surface 110 for mating with the first electronic component 102 and/or the second electronic component 104. The contacts 112 may be designed to have a low compression load for mating the first and/or second electronic components 102, 104 with the socket. In an exemplary embodiment, the contacts 112 are designed to be compressible vertically such that the ends of the contacts 112 compress directly into the socket body 106.

FIG. 2 is a top view of the electronic device 100 in accordance with an exemplary embodiment. The contacts 112 are arranged in rows and columns along row axes 116 and column axes 118, respectively. Optionally, the contacts 112 may be rotated at approximately 45° with respect to the row and column axes 116, 118. Optionally, a pitch between contacts 112 within a row may be approximately equal to a pitch between contacts 112 within a column. In alternative embodiments, the row pitch and the column pitch may be different than one another.

In an exemplary embodiment, both signal contacts (designated 112') and ground contacts (designated 112") are provided, with the signal contacts 112' conveying electrical signals between the first and second electronic components 102, 104 (both shown in FIG. 1). The ground contacts 112" provide electrical shielding between corresponding signal contacts 112' and may be electrically connected to a ground plane of the first electronic component 102 and/or the second electronic component 104. In an exemplary embodiment, each signal contact 112' within a row is separated from other signal contacts 112' within the row by a corresponding ground contact 112". Similarly, each signal contact 112' within a column is separated from other signal contacts 112' within the column by corresponding ground contacts 112". The signal and ground contacts have an alternating signal-ground-signal-ground arrangement. Other patterns of signal and ground contacts 112', 112" may be used in alternative embodiments. For example, a pair of signal contacts 112' may be arranged adjacent to one another and separated from other pairs by ground contacts 112". In an exemplary embodiment, the ground contacts 112" are wider that the signal contacts 112'. The wider profile of the ground contacts 112" provides better shielding between the signal contacts 112'.

FIG. 3 is a side perspective view of an assembled contact 112. FIG. 4 is an exploded, side perspective view of the contact 112. The contact 112 includes a contact body 120, a plunger 122 movable with respect to the contact body 120 and a biasing member 124 engaging the plunger 122.

In an exemplary embodiment, the contact body 120 is a stamped and formed piece. The contact body 120 includes a tip 130 and a tail 132 extending from the tip 130. The contact body 120 includes a spring beam 134 generally opposite the tip 130. The spring beam 134 engages, and is spring biased against, the plunger 122 to ensure electrical connection between the contact body 120 and the plunger 122.

The contact body 120 includes a shoulder 136 between the tip 130 and the spring beam 134. In an exemplary embodiment, the tail 132 defines the shoulder 136. For example, the tail 132, generally opposite the tip 130, may be bent at an angle to define the shoulder 136. The shoulder 136 may be provided along any portion of the tail 132 or the spring beam 134. In an exemplary embodiment, the shoulder 136 is oriented generally perpendicular with respect to the portion of the tail 132 extending between the shoulder 136 and the tip 130. Such portion of the tail 132 generally extends along a contact plane. The shoulder 136 is angled out of the contact plane.

The spring beam 134 extends from the shoulder 136 to a distal end 138. The distal end 138 of the spring beam 134 engages the plunger 122. The distal end 138 may be curved to ensure contact with the plunger 122. When the spring beam 134 engages the plunger 122, the spring beam 134 may be at least partially deflected to impart a spring force to ensure contact between the spring beam 134 and the plunger 122.

In an exemplary embodiment, the contact body 120 defines a receiving space 140 that receives a portion of the plunger 122 and the biasing member 124. In the illustrated embodiment, the receiving space 140 is defined at a bottom thereof by the shoulder 136, along a side thereof by a main wall 142 of the spring beam 134 and at a top thereof by a return 144 of the spring beam 134. The return 144 extends from the main wall 142 to the distal end 138. The return 144 extends toward the plunger 122 to angle the spring beam 134 into engagement with the plunger 122. The receiving space 140 is located generally to one side of the contact plane defined by the tail 132. The receiving space 140 allows the biasing member 124 to be positioned to one side of the contact plane. The plunger 122 is movable relative to the contact body 120, whereby the biasing member 124 may be compressed within the receiving space 140.

In an exemplary embodiment, the plunger 122 is a stamped and formed piece. The plunger 122 includes a tip 150 and a tail 152 extending from the tip 150. The plunger 122 includes a shoulder 156 generally opposite the tip 150. Optionally, the shoulder 156 may be defined by the tail 152. For example, a distal end 158 of the tail 152 may be bent out of plane with respect to a contact plane defined by the portion of the tail 152 between the shoulder 156 and the tip 150. The shoulder 156 may be located at any portion along the tail 152 in alternative embodiments. Optionally, the shoulder 156 may be oriented generally perpendicular with respect to the contact plane defined by the tail 152. The shoulder 156 is bent to face into the receiving space 140. The distal end 158 and/or shoulder 156 are received in the receiving space 140 above the biasing member 124.

When assembled, the plunger 122 is received in the receiving space 140. The shoulder 156 defines an upper ledge for the biasing member 124. The shoulder 136 defines a lower ledge for the biasing member 124. The biasing member 124 is positioned in a pocket 160 defined between the shoulder 156 of the plunger 122 and the shoulder 136 of the contact body 120. One side of the pocket 160 is defined by the main wall 142 and the other sides are open, however features may extend from the plunger 122 and/or the contact body 120 to at least partially close or cover one or more sides of the pocket 160. In an exemplary embodiment, the pocket 160 is open opposite the main wall 142 to receive the biasing member 124 and the plunger 122.

The plunger 122 and/or the contact body 120 are movable with respect to one another, thereby reducing a dimension of the pocket 160 and compressing the biasing member 124 in the pocket 160. The plunger 122 and/or the contact body 120 are movable in a biasing direction along a biasing axis 161. The pocket 160 is reduced in a dimension along the biasing axis 161. The biasing member 124 imparts biasing forces, acting in opposing directions along the biasing axis 161, on the shoulders 136, 156 to force the tips 130, 150 away from one another. During mating with the first and second electronic components, 102, 104 (both shown in FIG. 1), the tip 130 and/or the tip 150 may be pressed inward toward one another. For example, the tips 130, 150 may be pressed into the socket body 106 (shown in FIG. 1). The biasing member 124 forces the tips 130, 150 away from one another when the loads from the first and/or second electronic components 102, 104 are removed.

In the illustrated embodiment, the biasing member 124 is a coil spring. Other types of biasing members may be used in alternative embodiments. For example, the biasing member 124 may be a polymer element having spring characteristics. In an exemplary embodiment, the biasing member 124 is sized relatively small. The biasing member 124 is sized to fit within the pocket 160. A diameter of the biasing member 124 may be less than a width of the tails 132, 152. A change in length of the biasing member 124 defines the amount of deflection of the tip 130 and/or the tip 150. In an exemplary embodiment, no portion of the contact body 120 or the plunger 122 extends into the biasing member 124. In alternative embodiments, locating posts may extend slightly into the biasing member 124 to hold the position of the biasing member 124 with respect to the plunger 122 and/or the contact body 120. Such locating posts may only extend partially into the biasing member 124 for less than an entire length of the biasing member 124.

The plunger 122 has a front surface 162 and a rear surface 164 opposite the front surface 162. When assembled, the spring beam 134 engages the rear surface 164. As the plunger 122 and/or the contact body 120 are moved relative to one another, the spring beam 134 rides up or down along the rear surface 164 always maintaining contact with the rear surface 164. The front surface 162 defines the contact plane of the plunger 122. Similarly, a front surface 166 of the tail 132 of the contact body 120 defines a contact plane of the contact body 120. In an exemplary embodiment, the front surfaces 162, 166 are parallel to one another. In an exemplary embodiment, the front surfaces 162, 166 are coplanar. Alternatively, the front surfaces 162, 166 may be parallel to one another and non-coplanar. Optionally, the tail 132 and/or the tail 152 may be bent or angled such that the tip 130, 150 is nonparallel with respect to the contact plane of the tail 132, 152. For example, the tail 132 and/or 152 may be bent at approximately a 90° angle such that the tip 130 and/or 150 is generally perpendicular with respect to the corresponding contact plane. The biasing member 124 compresses in a direction parallel to the contact planes defined by the front surfaces 162, 166. The biasing member 124 is offset and shifted to one side of the contact planes defined by the front surfaces 162, 166.

An electrical path is defined through the contact 112 from the tip 150 along the tail 152 to the point where the spring beam 134 engages the tail 152. The electrical path diverges from the plunger 122 into the contact body 120 at the point where the spring beam 134 meets the tail 152. The electrical path continues through the spring beam 134, through the shoulder 136, and along the tail 132 to the tip 130. The electrical path does not extend through the biasing member 124. The electrical path is routed outside of the biasing member 124. The electrical path is independent of the mechanical path of compression of the contact 112. Optionally, some current may flow through the plunger 122, through the biasing member 124, and into the contact body 120, however, a majority of the current flows outside of the biasing member 124 through the spring beam 134.

FIG. 5 is a cross section view of a portion of the electronic device 100 showing two contacts 112 held within corresponding contact chambers 114 of the socket body 106. One of the contacts 112 is illustrated in an undeflected state while the other contact 112 is illustrated in a deflected state, wherein the biasing member 124 is at least partially compressed. In an exemplary embodiment, in the undeflected state, the tips 130 of the contact bodies 120 extend beyond the second surface 110, and the tips 150 and the plunger 122 both extend beyond the first surface 108. During mating with the first and second electronic components 102, 104, the plunger 122 and the contact body 120 are pressed into the socket body 106 until the tips 150, 130 are generally flush with the first and second surfaces 108, 110. Wiping may occur at the interface between the tips 150, 130 and the first and second electronic components 102, 104 during mating. The tips 150, 130 may be curved to ensure good electrical contact with the electronic components 102, 104.

The socket body 106 defines the contact chambers 114. The contact chambers 114 are sized to hold the contacts 112. In an exemplary embodiment, horizontal movement of the contacts 112 is restricted by the contact chambers 114. The contacts 112 are, however, capable of moving in a vertical direction, such as during mating with the first and second electronic components 102, 104.

In an exemplary embodiment, the socket body 106 includes a base 170 and a cover 172 coupled to the base 170. The socket body 106 includes slots 174 extending through the base 170 and slots 176 extending through the cover 172. The tips 130 of the contact bodies 120 extend through the slots 174 to an exterior of the socket body 106. The tips 150 of the plungers 122 extend through the slots 176 to an exterior of the socket body 106. Bottom walls 178 extend below the contact chambers 114 and define portions of the slots 174. Top walls 180 extend above the contact chambers 114 and define portions of the slots 176.

During assembly, the contacts 112 are loaded into corresponding contact chambers 114 in the cover 172. The contacts 112 are loaded into the cover 172 such that the tips 150 are aligned with and extend through the slots 176. The base 170 is then coupled to the cover 172 to close off the contact chambers 114. As the base 170 is coupled to the cover 172, the tips 130 of the contact bodies 120 extend through corresponding slots 174. The contacts 112 are captured in the contact chambers 114 by the base 170 and the cover 172.

FIG. 6 is a side perspective view of an alternative contact 190 formed in accordance with an exemplary embodiment. The contact 190 includes a contact body 192, a plunger 194 and a biasing member 196 between the contact body 192 and the plunger 194. The contact body 120 includes a solder ball 198 attached to the tip of the contact body 192. The solder ball 198 may be soldered to the second electronic component 104 (shown in FIG. 1).

FIG. 7 illustrates an alternative contact 212 formed in accordance with an exemplary embodiment. The contact 212 includes a contact body 220, a plunger 222, and a biasing member 224 for controlling relative movement between the plunger 222 and the contact body 220. In the illustrated embodiment, the biasing member 224 is a polymer element having spring characteristics. The biasing member 224 is cylindrical in shape, however other shapes are possible in alternative embodiments.

The plunger 222 engages a top end 226 of the biasing member 224. The contact body 220 engages a bottom end 228 of the biasing member 224. The biasing member 224 may be compressed between the contact body 220 and the plunger 222, such as during mating with the first and second electronic components 102, 104 (shown in FIG. 1). When the load from the first or second electronic components 102, 104 is released, the biasing member 224 is expanded and forces the plunger 222 to move relative to the contact body 220. The biasing member 224 is elastically deformed during compression such that compression and expansion of the biasing member 224 is repeatable.

FIG. 8 is a side view of an alternative contact 312 formed in accordance with an exemplary embodiment. The contact 312 includes a contact body 320, a plunger 322 and a biasing member 324 between the contact body 320 and the plunger 322. The contact 312 is similar to the contact 112, however the contact 312 has two points of contact between the contact body 320 and the plunger 322 as opposed to the single point of contact between the contact body 120 and the plunger 122 (both shown in FIGS. 3 and 4).

The contact body 320 includes a tip 330, a tail 332, and a spring beam 334 extending from the tail 332. A shoulder 336 is provided and the biasing member 324 engages the shoulder 336. The plunger 322 includes a tip 350, a tail 352 and a spring beam 354 extending from the tail 352. A shoulder 356 is provided at an end of the spring beam 354. The biasing member 324 engages the shoulder 356.

The spring beam 354 of the plunger 322 engages the tail 332 of the contact body 320 and is spring biased against the tail 332. Similarly, the spring beam 334 of the contact body 320 engages the tail 352 of the plunger 322 and is spring biased against the tail 352. Two points of contact, A and B, are defined between the contact body 320 and the plunger 322. The two points of contact ensure an electrical path is defined between the contact body 320 and the plunger 322.

FIG. 9 is a side perspective view of an assembled contact 412. FIG. 10 is a perspective view of the contact 412. FIG. 11 is an exploded, side perspective view of the contact 412. The contact 412 includes a contact body 420, a plunger 422 movable with respect to the contact body 420 and a biasing member 424 engaging the plunger 422.

In an exemplary embodiment, the contact body 420 is a stamped and formed piece. The contact body 420 includes a tip 430 and a tail 432 extending from the tip 430. The contact body 420 includes a spring beam 434 generally opposite the tip 430. The spring beam 434 engages, and is spring biased against, the plunger 422 to ensure electrical connection between the contact body 420 and the plunger 422.

The contact body 420 includes a shoulder 436 extending from the tail 432 between the tip 430 and the spring beam 434. The shoulder 436 is defined by a wing extending generally perpendicular to the tail 432. The shoulder 436 engages and holds the biasing member 424 in place relative to the contact 412. The shoulder 436 may extend from any portion of the tail 432 or the spring beam 434. In contrast to the contact 112 (shown in FIG. 3), the shoulder 436 does not form part of the electrical path of the contact 412. In an exemplary embodiment, the shoulder 436 is located along the tail 432 generally opposite the tip 430. The shoulder 436 is located proximate to the intersection of the spring beam 434 and the tail 432. The shoulder 436 is oriented generally perpendicular with respect to the tail 432. The tail 432 generally extends along a contact plane. The shoulder 436 is angled out of the contact plane. The spring beam 434 is also angled out of the contact plane.

The spring beam 434 extends from the tail 432 to a distal end 438. The distal end 438 of the spring beam 434 engages the plunger 422. The distal end 438 may be curved to ensure contact with the plunger 422. When the spring beam 434 engages the plunger 422, the spring beam 434 may be at least partially deflected to impart a spring force to ensure contact between the spring beam 434 and the plunger 422.

In an exemplary embodiment, the contact body 420 defines a receiving space 440 that receives a portion of the plunger 422 and the biasing member 424. In the illustrated embodiment, the receiving space 440 is defined along one side thereof by the tail 432, along a portion of another side thereof by the shoulder 436 and along a top thereof by a return 444 of the spring beam 434. The return 444 extends from the tail 432 to the distal end 438. The return 444 extends toward the plunger 422 to angle the spring beam 434 into engagement with the plunger 422. One or more sides of the receiving space 440 are open. The bottom of the receiving space 440 is not defined by the contact 412, but rather is defined by a portion of a socket body 406 (shown in FIG. 12). The receiving space 440 is located generally to one side of the contact plane defined by the tail 432. The receiving space 440 allows the biasing member 424 to be positioned to one side of the contact plane. The plunger 422 is movable within the receiving space 440. The biasing member 424 may be compressed within the receiving space 440.

In an exemplary embodiment, the plunger 422 is a stamped and formed piece. The plunger 422 includes a tip 450 and a tail 452 extending from the tip 450. The plunger 422 includes a shoulder 456 generally opposite the tip 450. The shoulder 456 is bent to face into the receiving space 440. The shoulder 456 is received in the receiving space 440 above the biasing member 424. In an exemplary embodiment, the plunger 422 includes a locating post 458 extending from the tail 452 and/or the shoulder 456 that extends into the biasing member 424. The locating post 458 is used to hold a relative position of the biasing member 424 relative to the contact 412. Such locating post 458 only extends partially into the biasing member 424 for less than an entire length of the biasing member 424. Optionally, as shown in FIG. 10, the plunger 422 may include wings or tabs 459 that are used to guide movement of the plunger 422 in the socket body 406 (shown in FIG. 12).

When assembled, the plunger 422 is received in the receiving space 440. The shoulder 456 defines an upper ledge for the biasing member 424. The shoulder 436 defines a supporting ledge for the biasing member 424. The biasing member 424 is supported at the bottom by the socket body 406 (shown in FIG. 12). The sides of the biasing member 424 may also be supported by walls of the socket body 406. The biasing member 424 is positioned in a pocket 460 defined by the shoulder 456 of the plunger 422 and the shoulder 436 of the contact body 420. One side of the pocket 460 is defined by the tail 432, another side of the pocket 460 is defined by the shoulder 436 and the other sides are open, however features may extend from the plunger 422 and/or the contact body 420 to at least partially close or cover one or more sides of the pocket 460. In an exemplary embodiment, the pocket 460 is open opposite the tail 432 to receive the biasing member 424 and the plunger 422.

The plunger 422 and/or the contact body 420 are movable with respect to one another. As the plunger 422 is pressed downward, a dimension of the pocket 460 is reduced and the biasing member 124 is compressed against the bottom support of the socket body 406. The biasing member 424 imparts biasing forces on the shoulder 456 in an upward direction to force the tip 450 outward.

In the illustrated embodiment, the biasing member 424 is a coil spring. Other types of biasing members may be used in alternative embodiments. For example, the biasing member 424 may be a polymer element having spring characteristics. In an exemplary embodiment, the biasing member 424 is sized relatively small. The biasing member 424 is sized to fit within the pocket 460.

The plunger 422 has a front surface 462 and a rear surface 464 opposite the front surface 462. When assembled, the spring beam 434 engages the rear surface 464. As the plunger 422 and/or the contact body 420 are moved relative to one another, the spring beam 434 rides up or down along the rear surface 464 always maintaining contact with the rear surface 464. The front surface 462 defines a contact plane of the plunger 422. The contact plane of the plunger 422 is offset with respect to the contact plane of the contact body 420. The biasing member 424 is located between the contact planes of the plunger 422 and the contact body 420. The contact planes of the plunger 422 and the contact body 420 are located outside of the perimeter of the biasing member 424. The biasing member 424 compresses in a direction parallel to the contact planes.

An electrical path is defined through the contact 412 from the tip 450 along the tail 452 to the point where the spring beam 434 engages the tail 452. The electrical path diverges from the plunger 422 into the contact body 420 at the point where the spring beam 434 meets the tail 452. The electrical path continues through the spring beam 434 and along the tail 432 to the tip 430. The electrical path does not extend through the biasing member 424. The electrical path is routed outside of the biasing member 424. The electrical path is independent of the mechanical path of compression of the contact 412.

FIG. 12 is a cross section view of a portion of a socket 400 showing contacts 412 held within corresponding contact chambers 414 of a socket body 406. The contacts 412 are illustrated in an undeflected state. In an exemplary embodiment, the tips 430 of the contact bodies 420 engage and are electrically connected to solder balls 466 at a surface 410 of the socket body 406 for mating with a second electronic component 404. The tips 450 of the plungers 422 extend beyond a first surface 408 of the socket body 406 for mating with a first electronic component 402. During mating with the first electronic component 402, the plunger 422 is pressed into the socket body 406 until the tips 450 are generally flush with the first surface 408.

In an exemplary embodiment, the socket body 406 includes a base 470 and a cover 472 coupled to the base 470. The socket body 406 includes slots 474 extending through the base 470 and slots 476 extending through the cover 472. The tips 430 of the contact bodies 420 extend through the slots 474 to mate with the solder balls 466. The tips 450 of the plungers 422 extend through the slots 476 to an exterior of the socket body 406. The base 470 includes bottom walls 478 that extend below the contact chambers 414 and define portions of the slots 474. The bottom walls 478 define bottoms of the pockets 460. The biasing members 424 rest on the bottom walls 478 and are compressed against the bottom walls 478. Optionally, the bottom walls 478 may include cups 479 that receives ends of the biasing members 424 to securely hold the ends of the biasing members 424. The cups may have fingers to capture the biasing members 424. Optionally, the biasing members 424 may be initially held by the base 470 in the cups 479 and loaded into the pockets of the contacts 412 when the base 470 is coupled to the cover 472. Top walls 480 extend above the contact chambers 414 and define portions of the slots 476.

During assembly, the contacts 412 are loaded into corresponding contact chambers 414 in the cover 472. The contacts 412 are loaded into the cover 472 such that the tips 450 are aligned with and extend through the slots 476. The base 470 is then coupled to the cover 472 to close off the contact chambers 414. As the base 470 is coupled to the cover 472, the tips 430 of the contact bodies 420 extend through corresponding slots 474. The contacts 412 are captured in the contact chambers 414 by the base 470 and the cover 472. The base 470 may at least partially compress the biasing member 424 when the base is coupled to the cover 472.

Optionally, the contacts 412 may have chamfers 482 that extend outward from the plungers 422 proximate to the tips 450. The chamfers 482 engage the top walls 480 to push the plungers 422 in a wiping direction 484 as the plungers 422 are pressed into the contact chambers 414, such as during mating with the first electronic component 402. Such lateral movement of the contacts 412 causes a wiping action on the corresponding pad of the first electronic component 402.

Figure 13:
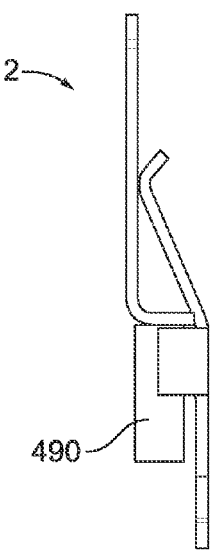
FIG. 13 is a side view of the contact shown in FIG. 9 in accordance with an exemplary embodiment in an uncompressed state.
Figure 14:
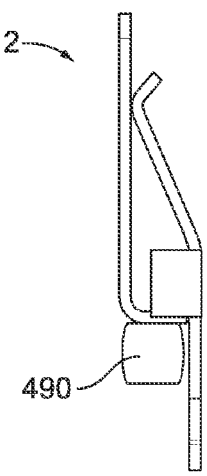
FIG. 14 is a side view of the contact shown in FIG. 9 in accordance with an exemplary embodiment in a compressed state.

FIGS. 13 and 14 illustrate the contact 412 with an alternative biasing member 490. FIG. 13 shows the biasing member 490 in an uncompressed state. FIG. 14 shows the biasing member 490 in a compressed state. The biasing member 490 is a polymer element having spring characteristics. The biasing member 490 is cylindrical in shape, however other shapes are possible in alternative embodiments.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A contact comprising:
a contact body including a tip, a spring beam opposite the tip and a shoulder between the tip and the spring beam;
a plunger movable with respect to the contact body, the plunger having a tip and a shoulder; and
a biasing member contained by the shoulders of the contact body and the plunger, the biasing member imparting a biasing force on the shoulder of the plunger, the biasing member being compressed as the plunger moves relative to the contact body;
wherein the spring beam engages the plunger between the tip and the shoulder of the plunger and is spring biased against the plunger to electrically couple the contact body and the plunger, an electrical path being defined from the tip of the plunger to the spring beam and to the tip of the contact body, the electrical path being routed outside of the biasing member; and
wherein the contact body, between the tip and the shoulder, extends along a contact plane, and the plunger, between the tip and the shoulder, extends along the contact plane, the shoulders being angled out of the contact plane to form a pocket therebetween that is shifted to one side of the contact plane, the biasing member being positioned in the pocket such that the biasing member is shifted to the side and outside of the contact plane.

2. The contact of claim 1, wherein the contact body and the plunger do not extend into the biasing member.

3. The contact of claim 1, wherein the contact body forms a receiving space that receives the biasing member such that the contact body extends along an exterior of the biasing member.

4. The contact of claim 1, wherein the contact body forms a receiving space between the shoulder and the spring beam that receives the biasing member and that receives a distal end of the plunger, the distal end being opposite the tip of the plunger.

5. The contact of claim 1, wherein the shoulder of the plunger is provided at a distal end of the plunger opposite the tip of the plunger, the shoulders of the contact body and the plunger being parallel to one another and spaced apart across a pocket, the biasing member being received in the pocket.

6. The contact of claim 1, wherein the contact body, between the tip and the shoulder, extends along a contact plane, and the plunger, between the tip and the shoulder, extends along the contact plane, the plunger being movable relative to the contact body in a biasing direction parallel to the contact plane.

7. The contact of claim 1, wherein the shoulder of the contact body is generally perpendicular to the shoulder of the plunger, the shoulder of the plunger engaging an end of the biasing member, the shoulder of the contact body engaging a side of the biasing member.

8. The contact of claim 1, wherein the biasing member comprises a polymer element having spring characteristics.

9. The contact of claim 8, wherein the polymer element is cylindrical in shape having a solid, cylindrical exterior surface extending between a top and a bottom.

10. The contact of claim 8, wherein the polymer element is shortened and widened when the polymer element is compressed.

11. A contact comprising:
a plunger having a tip and a shoulder;
a contact body including a tip, a spring beam opposite the tip and a shoulder between the tip and the spring beam, the spring beam engaging the plunger between the tip and the shoulder of the plunger and being spring biased against the plunger to electrically couple the contact body and the plunger; and
a biasing member contained by the shoulders of the contact body and the plunger, the biasing member being a polymer element having spring characteristics, the biasing member imparting biasing forces on the shoulder of the plunger, the biasing member being compressed as the plunger moves relative to the contact body;
wherein the contact body, between the tip and the shoulder, extends along a contact plane, and the plunger, between the tip and the shoulder, extends along the contact plane, the shoulders being angled out of the contact plane to form a pocket therebetween that is shifted to one side of the contact plane, the biasing member being positioned in the pocket such that the biasing member is shifted to the side and outside of the contact plane.

12. The contact of claim 11, wherein the contact body and the plunger do not extend into the biasing member.

13. The contact of claim 11, wherein the contact body forms a receiving space that receives the biasing member such that the contact body extends along an exterior of the biasing member.

14. The contact of claim 11, wherein the shoulder of the plunger is provided at a distal end of the plunger opposite the tip of the plunger, the shoulders of the contact body and the plunger being parallel to one another and spaced apart across a pocket, the biasing member being received in the pocket.

15. An electronic device comprising:
a socket body having a first surface and a second surface, the socket body having a plurality of contact chambers between the first and second surfaces; and
a plurality of contacts received in corresponding contact chambers, the contacts comprising:
a plunger having a tip and a shoulder, the tip of the plunger extending beyond the first surface for mating with a first component and being retractable into the socket body;
a contact body including a tip, a spring beam opposite the tip and a shoulder between the tip and the spring beam, the tip of the contact body extending beyond the second surface for mating with a second component and being retractable into the socket body, the spring beam engaging the plunger between the tip and the shoulder of the plunger and being spring biased against the plunger to electrically couple the contact body and the plunger; and a biasing member contained by the shoulders of the contact body and the plunger, the biasing member imparting biasing forces on the shoulder of the plunger, the biasing member being compressed as the plunger moves relative to the contact body;

wherein an electrical path is defined from the tip of the plunger to the spring beam and to the tip of the contact body, the electrical path being routed outside of the biasing member; and wherein the contact body, between the tip and the shoulder, extends along a contact plane, and the plunger, between the tip and the shoulder, extends along the contact plane, the shoulders being angled out of the contact plane to form a pocket therebetween that is shifted to one side of the contact plane, the biasing member being positioned in the pocket such that the biasing member is shifted to the side and outside of the contact plane.

16. The electronic device of claim 15, wherein the socket body includes a bottom wall of the contact chamber, the biasing member being compressed between the ledge and the shoulder of the plunger.

17. The electronic device of claim 15, wherein the socket body has a base and a cover coupled to the base, the contact chambers being defined at least in the cover, the contacts being loaded into the contact chambers in the cover and the contact chambers being closed off by the base after the contacts are loaded into the contact chambers.

18. The electronic device of claim 15, wherein the contact body forms a receiving space that receives the biasing member such that the contact body extends along an exterior of the biasing member.

19. The electronic device of claim 15, wherein the contact body forms a receiving space between the shoulder of the contact body and the spring beam that receives the biasing member and that receives a distal end of the plunger, the distal end being opposite the tip of the plunger.

20. The electronic device of claim 15, wherein the shoulder of the plunger is provided at a distal end of the plunger opposite the tip of the plunger, the shoulders of the contact body and the plunger being parallel to one another and spaced apart across a pocket, the biasing member being received in the pocket.

21. The electronic device of claim 15, wherein the biasing member comprises a polymer element having spring characteristics.

* * * * *